(12) United States Patent
Amos et al.

(10) Patent No.: US 7,056,782 B2
(45) Date of Patent: Jun. 6, 2006

(54) CMOS SILICIDE METAL GATE INTEGRATION

(75) Inventors: Ricky S. Amos, Rhinebeck, NY (US); Diane C. Boyd, LaGrangeville, NY (US); Cyril Cabral, Jr., Mahopac, NY (US); Richard D. Kaplan, Wappingers Falls, NY (US); Jakub T. Kedzierski, Peekskill, NY (US); Victor Ku, Tarrytown, NY (US); Woo-Hyeong Lee, Poughquag, NY (US); Ying Li, Poughkeepsie, NY (US); Anda C. Mocuta, LaGrangeville, NY (US); Vijay Narayanan, New York, NY (US); An L. Steegen, Stanford, CT (US); Maheswaran Surendra, Croton-on-Hudson, NY (US)

(73) Assignee: International Business Machines Corporation, Armonk, NY (US)

( * ) Notice: Subject to any disclaimer, the term of this patent is extended or adjusted under 35 U.S.C. 154(b) by 60 days.

(21) Appl. No.: 10/786,901

(22) Filed: Feb. 25, 2004

(65) Prior Publication Data

US 2005/0186747 A1 Aug. 25, 2005

(51) Int. Cl.
*H01L 21/8238* (2006.01)
(52) U.S. Cl. .................................................. 438/199
(58) Field of Classification Search ................ 438/199
See application file for complete search history.

(56) References Cited

U.S. PATENT DOCUMENTS 4,780,429 A 10/1988 Roche et al.
5,986,313 A 11/1999 Ueda et al.
6,100,145 A * 8/2000 Kepler et al. ............... 438/300
6,153,485 A * 11/2000 Pey et al. ................... 438/305
6,458,702 B1 10/2002 Aloni
6,596,576 B1 * 7/2003 Fu et al. ..................... 438/230

(Continued)

FOREIGN PATENT DOCUMENTS

FR 2 804 793 8/2001

(Continued)

OTHER PUBLICATIONS

"Self-Aligned Technique Employing Planarized Resist For Reducing Poly-Silicon Sheet Resistance By Formation of a Metal Silicide." IBM Technical Disclosure Bulletin, IBM Corp. vol. 30 No. 5 (1987).

(Continued)

*Primary Examiner*—Asok Kumar Sarkar
(74) *Attorney, Agent, or Firm*—Scully, Scott, Murphy & Presser, P.C.; Robert M. Trepp, Esq.

(57) ABSTRACT

The present invention provides a complementary metal oxide semiconductor integration process whereby a plurality of silicided metal gates are fabricated atop a gate dielectric. Each silicided metal gate that is formed using the integration scheme of the present invention has the same silicide metal phase and substantially the same height, regardless of the dimension of the silicide metal gate. The present invention also provides various methods of forming a CMOS structure having silicided contacts in which the polySi gate heights are substantially the same across the entire surface of a semiconductor structure.

19 Claims, 10 Drawing Sheets

U.S. PATENT DOCUMENTS

| | | | |
|---|---|---|---|
| 6,656,764 B1 | 12/2003 | Wang et al. | |
| 6,867,130 B1 * | 3/2005 | Karlsson et al. | 438/655 |
| 6,924,184 B1 * | 8/2005 | Cave et al. | 438/201 |
| 2002/0123222 A1 | 9/2002 | Wu | |
| 2003/0141565 A1 | 7/2003 | Hirose et al. | |
| 2003/0230811 A1 | 12/2003 | Kim | |

FOREIGN PATENT DOCUMENTS

| | | |
|---|---|---|
| JP | 2002-217411 | 8/2002 |
| WO | WO 99/53535 | 10/1999 |

OTHER PUBLICATIONS

Oh J. et al. "Interdigitated Ge p-i-n Photodetectors Fabricated on a Si Substrate Using Graded SiGe Buffer Layers." IEEE Journal of Quantum Electronics, vol. 38, No. 9, (2002).

Jones R.E. et al. "Fabrication and Modeling of Gigahertz Photodetectors in Heteroepitaxial Ge-on-Si Using a Graded Buffer Layer Deposited by Low Energy Plasma Enhanced CVD." IEDM p. 793 (2002).

* cited by examiner

US 7,056,782 B2

CMOS SILICIDE METAL GATE INTEGRATION

FIELD OF THE INVENTION

The present invention relates to the fabrication of circuit devices on semiconductor substrates, and more particularly to a complementary metal oxide semiconductor (CMOS) transistor fabrication method for forming silicide metal gates that have substantially the same height. The present invention is also related to a method of forming silicided source/drain regions without effecting the height of the polysilicon gate conductor.

BACKGROUND OF THE INVENTION

Throughout the prior art, metal gate integration has proven difficult to achieve in a conventional process flow for CMOS transistors. Most metal gate materials interact with the gate dielectric during the high temperature processing needed for source/drain (S/D) junction activation anneals. The need to keep the metal gate stack from receiving high temperature anneals has lead to the development of the "gate last" or "replacement gate" process for which the gate stack is fabricated last and remains below 500° C. during subsequent processing. Although the prior art replacement gate process increases the number of material choices for a metal gate, the process complexity and cost increases.

Co-assigned U.S. application Ser. No. 10/300,165, filed Nov. 20, 2002 describes an approach for forming a metal gate silicide in a conventional CMOS transistor processing flow in which the "replacement gate" process is not used. In this alternative approach, the number of added processing steps has been minimized therefore keeping the complexity to a minimum and cost down.

The avoidance of the "replacement gate" process is a big advantage. A second advantage to the approach described in the '165 application is the ability to deposit the silicide metal via standard physical vapor deposition. Since the metal is not being directly deposited on the gate dielectric in the '165 application, there is no need for chemical vapor deposition (CVD) or atomic layer deposition (ALD), which keeps the gate dielectric damage to a minimum by eliminating the use of a plasma. An additional advantage is the ease of passivation of the gate dielectric after silicide metal gate formation. Hydrogen readily diffuses through the silicide allowing passivation in a conventional furnace anneal process.

Forming the metal gate silicide in a conventional CMOS process flow can be accomplished with the addition of several steps. The following is an illustration of such a process flow: A nitride or oxide cap layer is typically needed on top of the gate polycrystalline Si (i.e., polySi) during the silicidation of the source/drain region. The oxide or nitride cap prevents silicidation of the gate polySi region during the source/drain silicidation. Besides the inclusion of the polySi cap, all other processing steps are conventional through the formation of the silicide contacts on the source/drain regions.

After silicide source/drain contact formation, a nitride/oxide bilayer is typically deposited on the CMOS structure and planarized so as to cover the source/drain silicide and the trench isolation regions. The planarization is typically performed utilizing a chemical mechanical polishing (CMP) process. CMP is performed such that the cap on the polySi gate stack is removed and the polySi is in contact with the planarized surface.

At this point, a conventional self-aligned silicide (i.e., salicide) process may be used to form the silicide metal gate. After this, the conventional CMOS integration flow is followed to form the multiple back end interconnect levels.

A disadvantage for the silicide metal gate process described above is that after CMP the polySi gate height (thickness) varies depending on the length of the gate. This variation comes about due to (1) the within-die, with-in wafer, wafer-to-wafer, and lot-to-lot non-uniformity during gate CMP, and (2) incoming topography between shallow trench isolation (STI) and silicon surface (active area) created during STI CMP and subsequent cleans.

Although STI CMP has been optimized to minimize STI-to-Si step height, such step height still exists and varies depending on the pattern density of the device. Any variation in such step height will be translated into gate height variation later on during the gate CMP. The gate CMP itself adds more non-uniformity and variation on gate height to features with different pattern densities. A combination of both can create up to 400 Å gate height variations within a given wafer. With such variation, when the silicide metal is deposited different phases of the silicide may form since in different gates there are differing amounts of polySi which can be consumed in the silicide formation. These different phases can lead to different workfunctions (hence transistor turn on voltages) and variations in resistance (device performance).

In view of the drawbacks mentioned above, there is a need for providing a new and improved CMOS silicide metal gate integration scheme that allows for the formation of a silicide metal gate on regions of polySi that have substantially the same height regardless of the gate dimensions.

SUMMARY OF THE INVENTION

In a first embodiment of the present invention, a CMOS silicide metal gate integration approach that does not have the shortcomings of variations in the polySi gate stack height which lead to variations in the silicide metal gate phases that form is provided. The integration approach of the present invention keeps the processing complexity to a minimum thereby not increasing the production cost of CMOS transistors.

The above objects are achieved in the first embodiment of the present invention by utilizing a thick dielectric cap (having a thickness on the order of about 20 nm or greater, and more preferably 50 nm or greater) on top of the polySi gate. After deposition and planarization of an interlevel dielectric, the dielectric cap is selectively removed, with respect to the interlevel dielectric and polySi gate, by reactive ion etching (RIE). Since the polySi gate is not etched, it will have substantially the same thickness (i.e., as deposited thickness) across the wafer regardless of gate dimension (length). After the polySi is consumed to form the metal gate silicide, the silicide height and silicide phase across the wafer will be substantially the same due to the initial uniform polySi provided by the inventive integration scheme. Cross sectional imaging can be used to determine the height of the metal gate silicides formed by the integration scheme of the first embodiment of the present invention.

One major advantage of this inventive integration scheme over a prior art integration scheme is the fact that the metal polySi reaction for silicide formation will occur consuming the same amount of polySi regardless of gate dimension preventing non-uniform or incomplete phase formation. As an example, with prior art integration schemes it is possible that some gates have twice as much polySi as others depending on the dimension. In this case, if $CoSi_2$ is to be formed on the thicker gates where more polySi is located, $CoSi_2$ will form, however, on thinner gates where less polySi is located, the CoSi phase will form. The CoSi phase has a 5–6× higher resistivity compared to $CoSi_2$. This leads to non-uniform performance.

In broad terms, the first embodiment of the present invention comprises the steps of:

providing a plurality of polySi gates overlying a semiconductor substrate, each polySi gate comprises a dielectric cap located on an upper surface thereof;

forming silicided source/drain regions in the semiconductor substrate;

forming a planarized dielectric stack on the semiconductor substrate;

performing an etching process to expose an upper surface of each polySi gate; and performing a salicide process which converts each polySi gate to a metal silicide gate, wherein each metal silicide gate has substantially the same height, is composed of the same silicide phase and has substantially the same workfunction for the same polySi ion implant conditions.

Another aspect of the present invention relates to a CMOS structure that is produced using the inventive integration scheme mentioned above. In broad terms, the CMOS structure of the present invention comprises:

a plurality of silicided metal gates located atop a surface of a gate dielectric, each of the silicided metal gates is composed of the same silicide phase, has substantially the same height and has substantially the same workfunction for the same polySi ion implant conditions, regardless of the dimension of the silicided metal gate.

A second embodiment of the present invention relates to a method of forming a CMOS structure having silicided source/drain regions (i.e., contacts) whereby the height of the polysilicon gates is substantially the same across the entire surface of a semiconductor structure. The second embodiment of the present invention comprises the steps of:

providing a structure comprising a plurality of polySi gates overlying a semiconductor substrate;

depositing a metal to be silicided with an optional capping layer atop the structure including the polySi gates and the semiconductor substrate;

forming a recessed material by reflowing between each polySi gate;

removing the silicide metal and optional capping layer from atop each of the polySi gates;

removing the recessed material formed by reflow; and annealing the structure so as to form silicide contact (source/drain) regions between each of the polySi gates.

A third embodiment of the present invention relates to a method of forming a CMOS structure having silicided source/drain regions whereby the height of the polysilicon gates is also substantially the same across the entire surface of a semiconductor structure.

providing a structure comprising a plurality of polySi gates overlying a semiconductor substrate;

forming a bilayer layer comprising a metal-containing layer and a capping layer atop the structure including the polySi gates and the semiconductor substrate;

forming a planarizing dielectric on the semiconductor substrate;

exposing the metal-containing layer atop each polySi gate;

removing the metal-containing layer from atop each polySi gate; and annealing the structure so as to form silicide contact regions between each of the polySi gates.

In either the second embodiment or the third embodiment described above, metal silicide gates that have substantially the same height, phase and workfunction with the same polySi predoping conditions can be formed.

The second and third embodiments of the present invention provide an alternative CMOS structure of the present invention which comprises:

a plurality of polySi gates located atop a surface of a gate dielectric, each of the polySi gates has substantially the same height, regardless of the dimension of the polysilicon gates; and silicided contacts located between each polySi gate.

In the present invention, the silicide contacts (or silicide source/drain regions) are self-aligned to an edge of a spacer located on vertical sidewalls of each polySi or silicide metal gate.

DETAILED DESCRIPTION OF THE INVENTION

Figure 1:
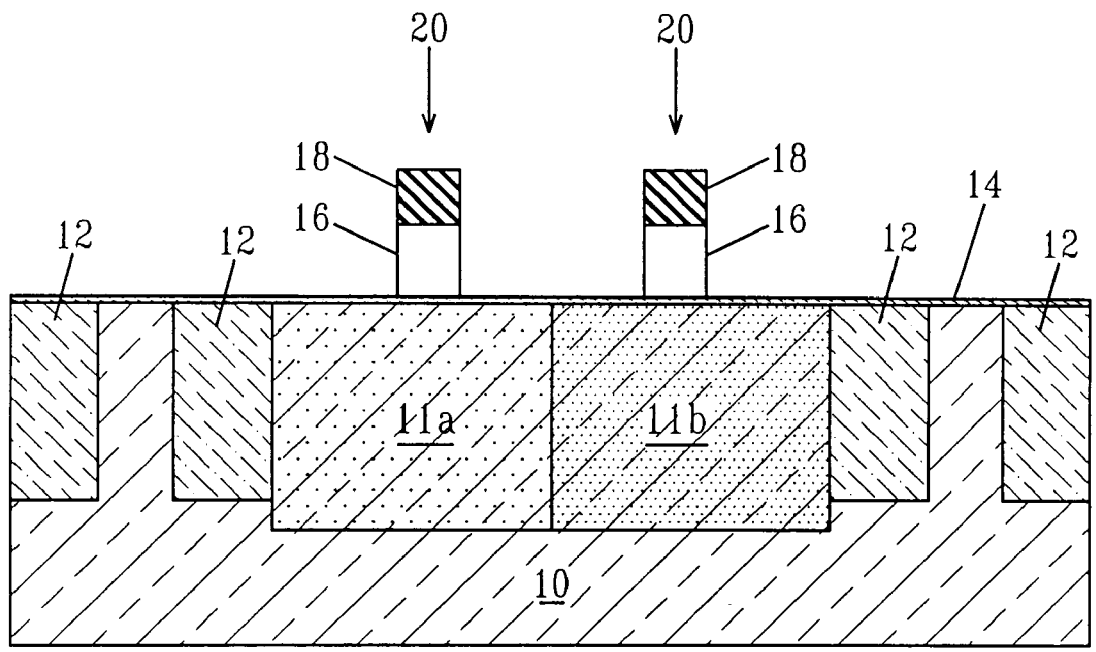
FIG. 1 is a pictorial representation (through a cross sectional view) showing an initial capped polySi gate structure employed in the first embodiment of the present invention.

The present invention, which in one embodiment, provides a CMOS silicide metal gate integration process that is capable of forming silicide metal gates that are composed of the same silicide phase, and have substantially the same workfunctions and heights regardless of each gates dimension, will now be described in greater detail by referring to the drawings that accompany the present application. In the accompanying drawings, which are not drawn to scale, like and/or corresponding elements are referred to by like reference numerals.

Reference is made to FIGS. 1–10, which are cross sectional views of a CMOS structure during various stages of the first embodiment of the present invention. Although the drawings show the presence of two polySi gates (i.e., a CMOS transistor structure with pFET and nFET transistors), the present invention is not limited to that number of polySi gates. Instead, the present integration process works for any number of polySi gates. Hence, a plurality of polySi gates may be present across a single semiconductor structure.

FIG. 1 shows an initial structure that is employed in the first embodiment of the present invention. Specifically, the initial structure shown in FIG. 1 comprises semiconductor substrate 10 having isolation regions 12 formed therein. The initial structure also includes a gate dielectric 14 located on top of the semiconductor substrate 10 as well as on top of the isolation regions 12. This is the case if the dielectric is deposited as for a high k material, but not if the dielectric is grown as is typical for $SiO_2$ or $SiO_xN_y$. In the present invention, each polySi gate 16 has a dielectric cap 18 and both are located atop selected portions of the gate dielectric 14. Each polySi gates 16 and its corresponding dielectric cap 18 are referred to herein as a gate stack 20.

The semiconductor substrate 10 of the initial structure shown in FIG. 1 comprises any semiconducting material including, but not limited to: Si, Ge, SiGe, SiC, SiGeC, Ga, GaAs, InAs, InP and all other III/V compound semiconductors. Semiconductor substrate 10 may also comprise a layered semiconductor such as Si/SiGe, a silicon-on-insulator (SOI) or a SiGe-on-insulator (SGOI). In some embodiments of the present invention, it is preferred that the semiconductor substrate 10 be composed of a Si-containing semiconductor material. The semiconductor substrate 10 may be doped, undoped or contain doped and undoped regions therein.

In FIG. 1, reference numeral 11a refers to a first doped (n- or p-) region, and reference numeral 11b refers to a second doped (n- or p-) region. The first doped region and the second doped region may be the same, or they may have different conductivities. These doped regions are known as "wells".

The isolation regions 12 are formed into the semiconductor substrate 10. The isolation regions 12 may be trench isolation regions, as shown, or field oxide isolation regions. The trench isolation regions are formed utilizing a conventional trench isolation process well known to those skilled in the art. For example, lithography, etching and filling of the trench with a trench dielectric may be used in forming the trench isolation regions. Optionally, a liner may be formed in the trench prior to trench fill, a densification step may be performed after the trench fill and a planarization process may follow the trench fill as well. The field oxide regions may be formed utilizing a so-called local oxidation of silicon process.

After forming the isolation regions 12 within the semiconductor substrate 10, gate dielectric 14 is formed on the entire surface of the structure including the semiconductor substrate 10 and atop the isolation regions 12 if it is a deposited dielectric. The gate dielectric 14 can be formed by a thermal growing process such as, for example, oxidation, nitridation or oxynitridation. Alternatively, the gate dielectric 14 can be formed by a deposition process such as, for example, chemical vapor deposition (CVD), plasma-assisted CVD, atomic layer deposition (ALD), evaporation, reactive sputtering, chemical solution deposition and other like deposition processes. The gate dielectric 14 may also be formed utilizing any combination of the above processes.

The gate dielectric 14 is comprised of an insulating material including, but not limited to: an oxide, nitride, oxynitride and/or silicate. In one embodiment, it is preferred that the gate dielectric 14 is comprised of an oxide such as, for example, $SiO_2$, $HfO_2$, $ZrO_2$, $Al_2O_3$, $TiO_2$, $La_2O_3$, $SrTiO_3$, $LaAlO_3$, and mixtures thereof.

The physical thickness of the gate dielectric 14 may vary, but typically, the gate dielectric 14 has a thickness from about 0.5 to about 10 nm, with a thickness from about 0.5 to about 3 nm being more typical.

After forming the gate dielectric 14, a blanket layer of polysilicon (i.e., polySi) is formed on the gate dielectric 14 utilizing a known deposition process such as, for example, physical vapor deposition, CVD or evaporation. The blanket layer of polysilicon may be doped or undoped. If doped, an in-situ doping deposition process may be employed in forming the same. Alternatively, a doped polySi layer can be formed by deposition, ion implantation and annealing. The doping of the polySi layer will shift the workfunction of the silicide gate formed. Illustrative examples of dopant ions include As, P, B, Sb, Bi, In, Al, Ga, Tl or mixtures thereof. The thickness, i.e., height, of the polysilicon layer deposited at this point of the present invention may vary depending on the deposition process employed. Typically, the polysilicon layer has a vertical thickness from about 20 to about 180 nm, with a thickness from about 40 to about 150 nm being more typical.

After deposition of the blanket layer of polysilicon, a dielectric cap layer is formed atop the blanket layer of polysilicon utilizing a deposition process such as, for example, physical vapor deposition or chemical vapor deposition. The dielectric cap layer may be an oxide, nitride, oxynitride or any combination thereof. In one embodiment, a nitride such as, for example, $Si_3N_4$, is employed as the dielectric cap layer. The thickness, i.e., height, of the dielectric cap layer is from about 20 to about 180 nm, with a thickness from about 30 to about 140 nm being more typical.

In one embodiment, the blanket layer of polysilicon and dielectric cap layer have a total height that ranges from 70 to 180 nm. In yet another embodiment, the height of the blanket polysilicon layer and the dielectric cap layer is about 120 nm; typically 70 nm polySi and 50 nm dielectric cap.

The blanket polysilicon layer and dielectric cap layer are then patterned by lithography and etching so as to provide patterned gate stacks 20. The patterned gate stacks 20 may have the same dimension, i.e., length, or they can have variable dimensions to improve device performance. As shown in FIG. 1, each patterned gate stack 20 includes a polySi gate 16 and dielectric cap 18. The lithography step includes applying a photoresist to the upper surface of the dielectric cap layer, exposing the photoresist to a desired pattern of radiation and developing the exposed photoresist utilizing a conventional resist developer. The pattern in the photoresist is then transferred to the dielectric cap layer and the blanket layer of polysilicon utilizing one or more dry etching steps. In some embodiments, the patterned photoresist may be removed after the pattern has been transferred into the dielectric cap layer. In other embodiments, the patterned photoresist is removed after etching has been completed.

Suitable dry etching processes that can be used in the present invention in forming the patterned gate stacks 20 include, but are not limited to: reactive ion etching, ion beam etching, plasma etching or laser ablation. The dry etching process employed is typically selective to the underlying gate dielectric 14 therefore this etching step does not typically remove the gate dielectric. In some embodiments, this etching step may however be used to remove portions of the gate dielectric 14 that are not protected by the gate stacks 20.

Figure 2:
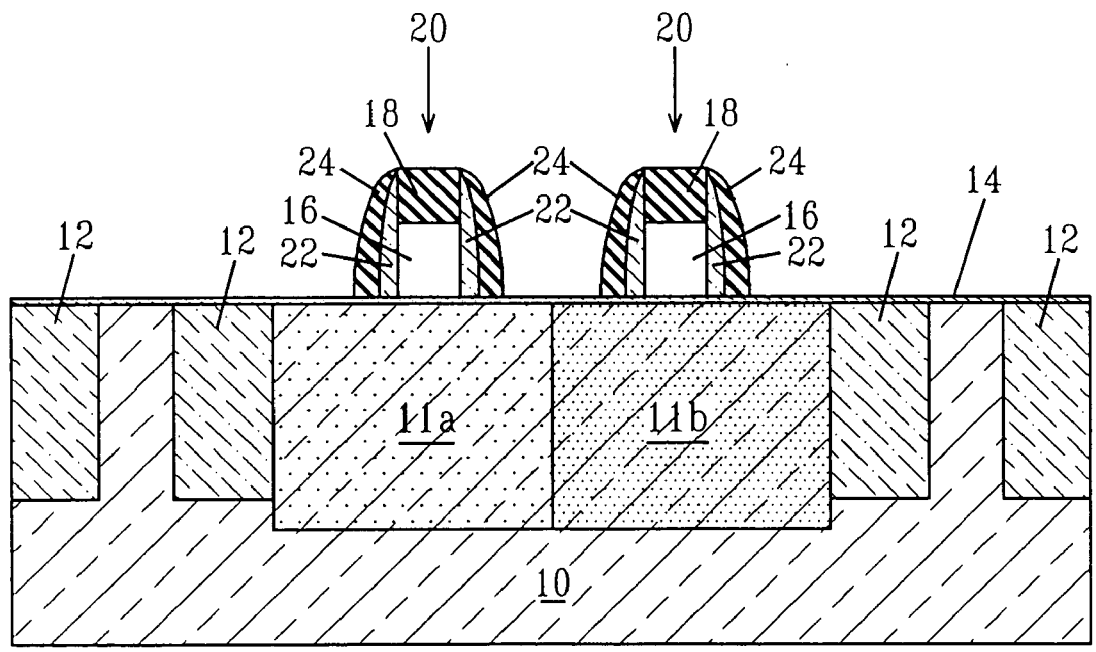
FIG. 2 is a pictorial representation (through a cross sectional view) showing the structure after double spacers have been formed on the sidewalls of each of the capped polySi gates illustrated in FIG. 1.

Next, at least one spacer is formed on exposed sidewalls of each patterned gate stack 20. The at least one spacer is comprised of an insulator such as an oxide, nitride, oxynitride and/or any combination thereof. The at least one spacer is formed by deposition and etching. FIG. 2 shows an embodiment of the present invention in which two spacers are formed on each exposed sidewall of gate stacks 20. In particular, FIG. 2 shows a structure including first spacer 22 having a first width and second spacer 24 having a second width wherein the first width is narrower than the second width. In another embodiment, the two spacer scheme is replaced by a single spacer in which the single spacer is a wide spacer having a width that is substantially equal to the sum of the first and second widths shown in FIG. 2.

When first and second spacers are used, the first and second spacers are composed of different insulators. For example, the first spacer 22 may be comprised of $SiO_2$ and the second spacer 24 may be comprised of $Si_3N_4$.

The width of the spacers must be sufficiently wide enough such that the source/drain silicide contacts (to be subsequently formed) do not encroach underneath the edges of the gate stack. Typically, the source/drain silicides do not encroach underneath the edges of the gate stack when the spacers have a width, as measured at the bottom, from about 20 to about 80 nm.

After spacer formation, source/drain diffusion regions (not specifically shown) are formed into the substrate. The source/drain diffusion regions are formed utilizing ion implantation and an annealing step. The annealing step serves to activate the dopants that were implanted by the previous implant step. The conditions for the ion implantation and annealing are well known to those skilled in the art.

Next, and if not previously removed, the exposed portion of the gate dielectric 14 is removed utilizing a chemical etching process that selectively removes the gate dielectric 14. This etching step stops on an upper surface of the semiconductor substrate 10 as well as an upper surface of the isolation regions 12. Although any chemical etchant may be used in removing the exposed portions of the gate dielectric 14, in one embodiment dilute hydrofluoric acid (DHF) is used.

Source/drain silicide contacts 26 are then formed using a salicide process which includes the steps of depositing a metal on an exposed surface of the substrate 10 that includes the source/drain diffusion regions, first annealing to form a silicide, selective etching any non-reacted metal including capping layer if used and, if needed, performing a second annealing step. The resultant structure including the source/drain silicide contacts 26 is shown, for example, in FIG. 3.

When the semiconductor substrate does not include silicon, a layer of silicon (not shown) can be grown atop the exposed surface of the semiconductor substrate 10 and can be used in forming the source/drain silicide contacts.

The metal used in forming the source/drain silicide contacts comprises any metal that is capable of reacting with silicon to form a metal silicide. Examples of such metals include, but are not limited to: Ti, Ta, W, Co, Ni, Pt, Pd and alloys thereof. In one embodiment, Co is a preferred metal.

In such an embodiment, the second annealing step is required. In another embodiment, Ni or Pt are preferred. In this embodiment, the second annealing step is typically not performed.

The metal may be deposited using any conventional deposition process including, for example, sputtering, chemical vapor deposition, evaporation, chemical solution deposition, plating and the like.

The first anneal is typically performed at lower temperatures than the second annealing step. Typically, the first annealing step, which may, or may not, form a high resistance silicide phase material, is performed at a temperature from about 300° to about 600° C. using a continuous heating regime or various ramp and soak heating cycles. More preferably, the first annealing step is performed at a temperature from about 350° to about 550° C. The second annealing step is performed at a temperature from about 600° C. to about 800° C. using a continuous heating regime or various ramp and soak heating cycles. More preferably, the second annealing step is performed at a temperature from about 650° C. to about 750° C. The second anneal typically converts the high resistance silicide into a silicide phase of lower resistance.

The salicide anneals are carried out in a gas atmosphere, e.g., He, Ar, $N_2$ or forming gas. The source/drain silicide contact annealing steps may use different atmospheres or the annealing steps may be carried out in the same atmosphere. For example, He may be used in both annealing steps, or He can be used in the first annealing step and a forming gas may be used in the second annealing step.

Figure 3:
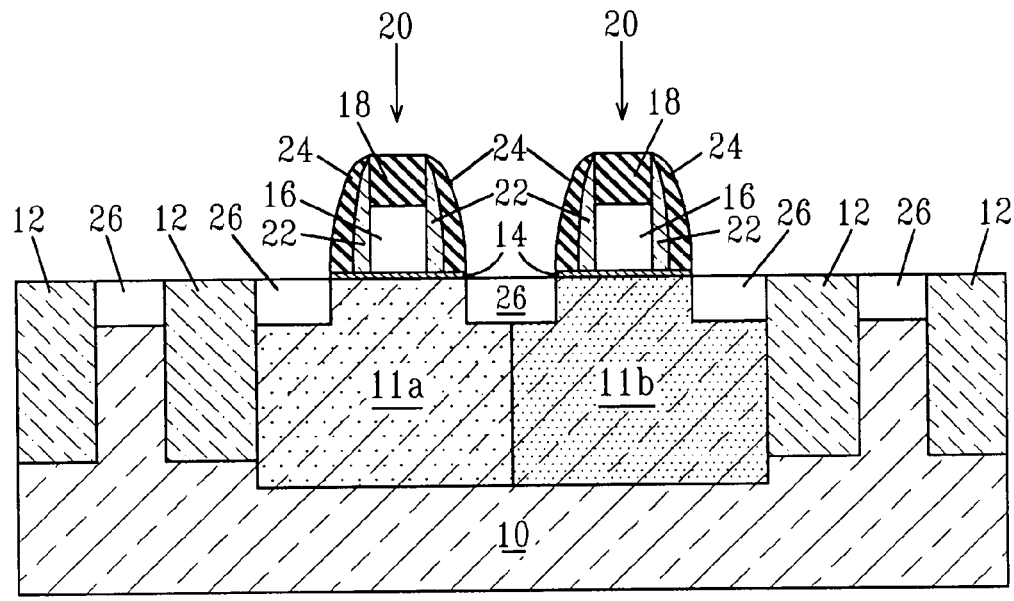
FIG. 3 is a pictorial representation (through a cross sectional view) showing the structure after source/drain silicidation has been performed on the structure illustrated in FIG. 2.
Figure 4:
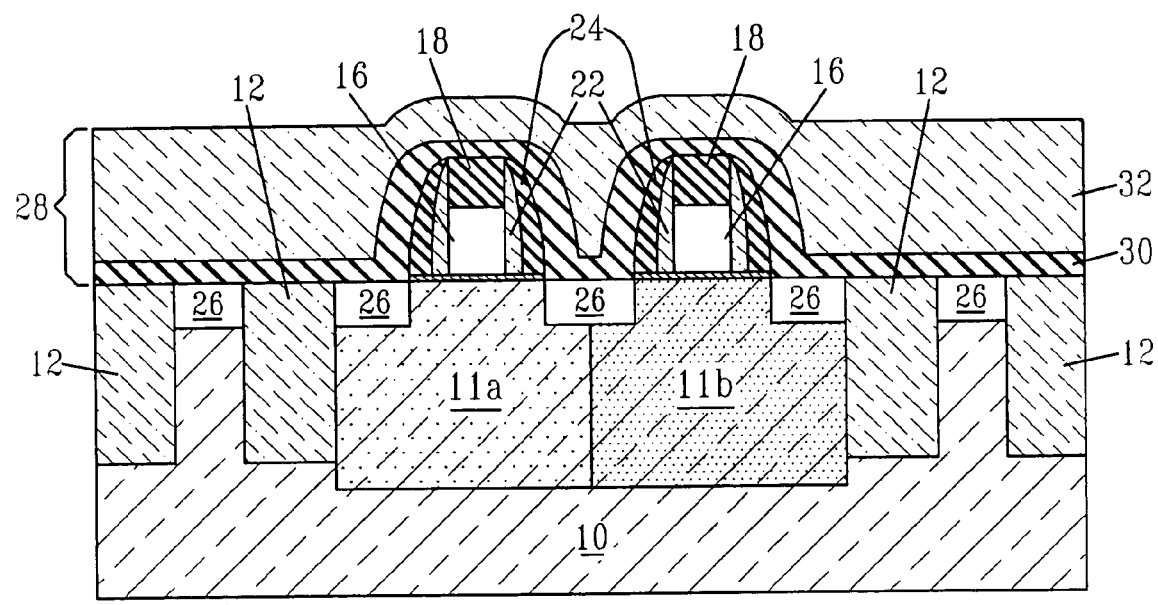
FIG. 4 is a pictorial representation (through a cross sectional view) showing the structure after deposition of a nitride/oxide dielectric stack on the structure illustrated in FIG. 3.
Figure 5:
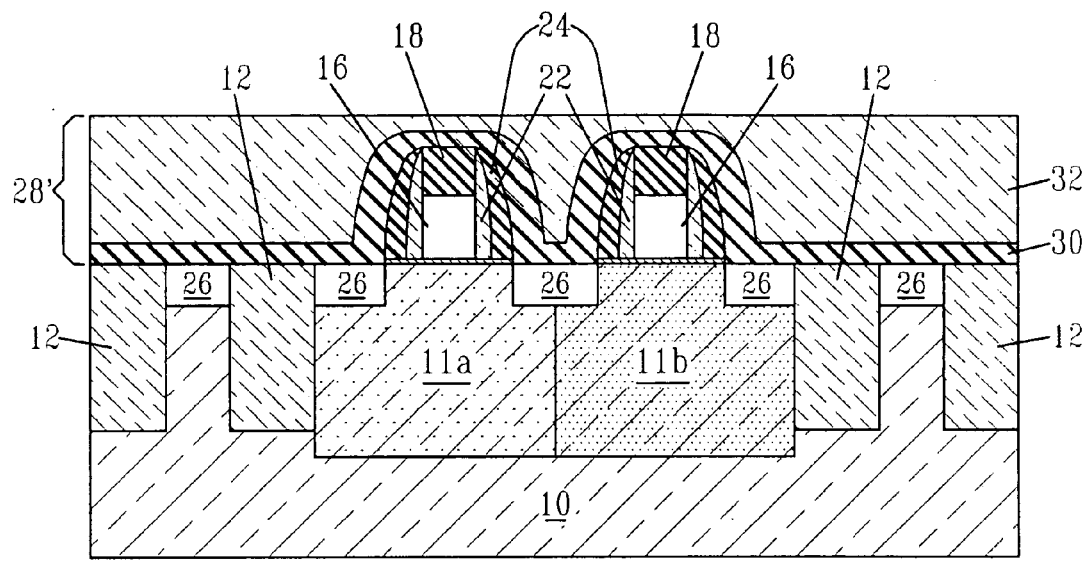
FIG. 5 is a pictorial representation (through a cross sectional view) showing the structure after planarizing the structure illustrated in FIG. 4.

After forming the structure shown in FIG. 3, a dielectric stack 28 comprising a first dielectric layer 30 and a second dielectric layer 32 is formed providing the structure shown in FIG. 4. The first dielectric layer 30 serves an etch stop layer, while the second dielectric layer 32 serves as an interlevel dielectric. The first and second dielectric layers of the dielectric stack 28 are composed of different insulating materials including, for example, oxides, nitrides and oxynitrides.

In accordance with the present invention, the first dielectric layer 30 is comprised of the same dielectric as that of dielectric cap 18. In one embodiment of the present invention, first dielectric layer 30 of dielectric stack 28 is comprised of $Si_3N_4$, while the second dielectric layer is comprised of $SiO_2$. As shown, the dielectric stack 28 covers the isolation regions 12, the source/drain silicide contacts 26 as well as the gate stacks 20.

The first dielectric layer 30 and the second dielectric 32 are formed utilizing the same or different deposition process. Examples of suitable deposition processes that can be used in forming layers 30 and 32 of dielectric stack 28 include, but are not limited to: chemical vapor deposition, atomic layer deposition, physical vapor deposition, chemical solution deposition, evaporation and other like deposition processes. The thickness of dielectric stack 28 may vary, but it must have a thickness that is higher than the height of gate stacks 20.

After formation of the dielectric stack 28, the second dielectric layer 32 is planarized providing a structure including a planarized dielectric stack 28'. Such a structure is shown, for example, in FIG. 5. The planarized dielectric stack 28' can be formed by a conventional planarization process including, for example, chemical mechanical polishing and/or grinding.

Figure 6:
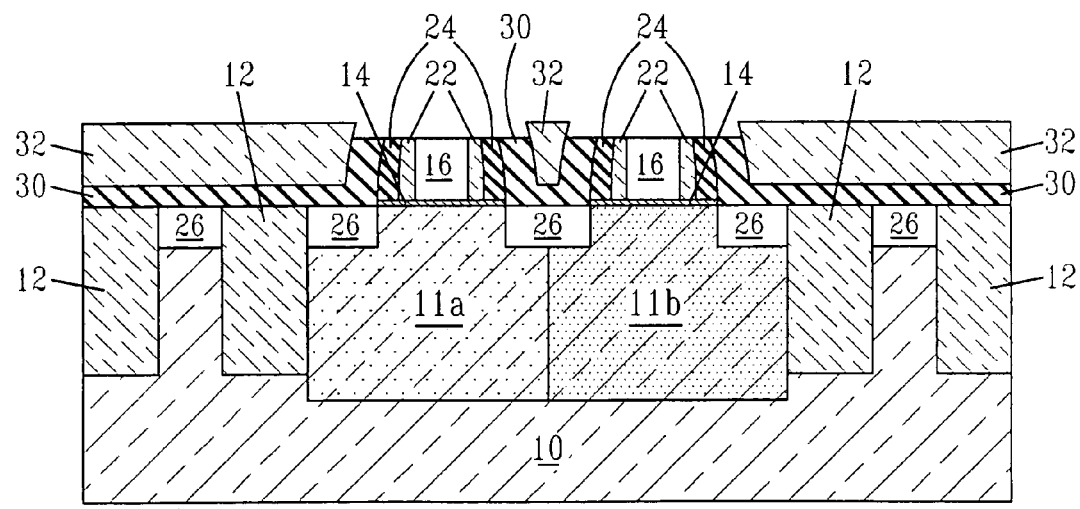
FIG. 6 is a pictorial representation (through a cross sectional view) showing the structure after etching back oxide and nitride, including cap material, exposing an upper surface of each polySi gate.
Figure 7:
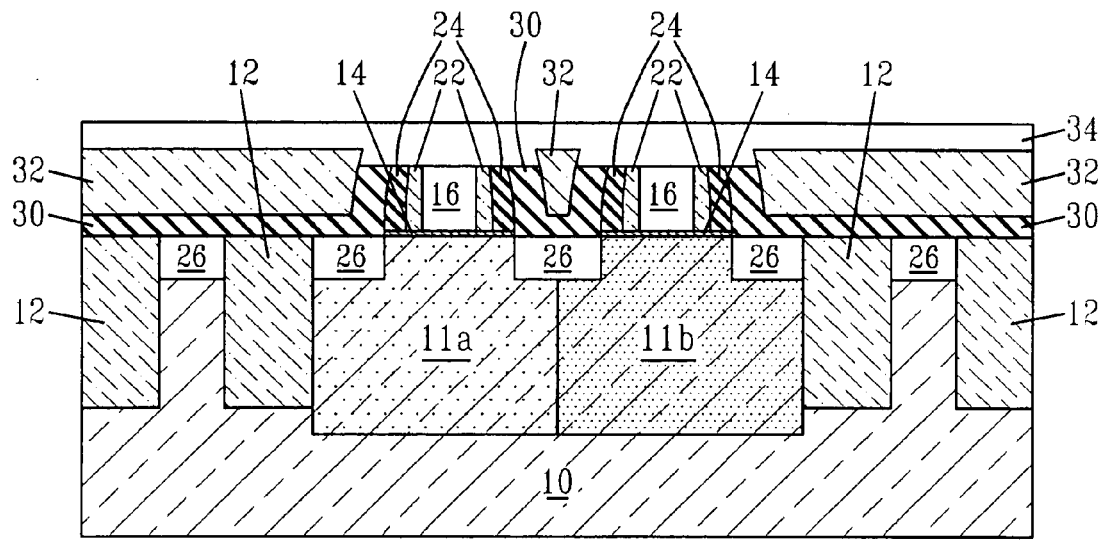
FIG. 7 is a pictorial representation (through a cross sectional view) showing the structure after silicide metal deposition.
Figure 8:
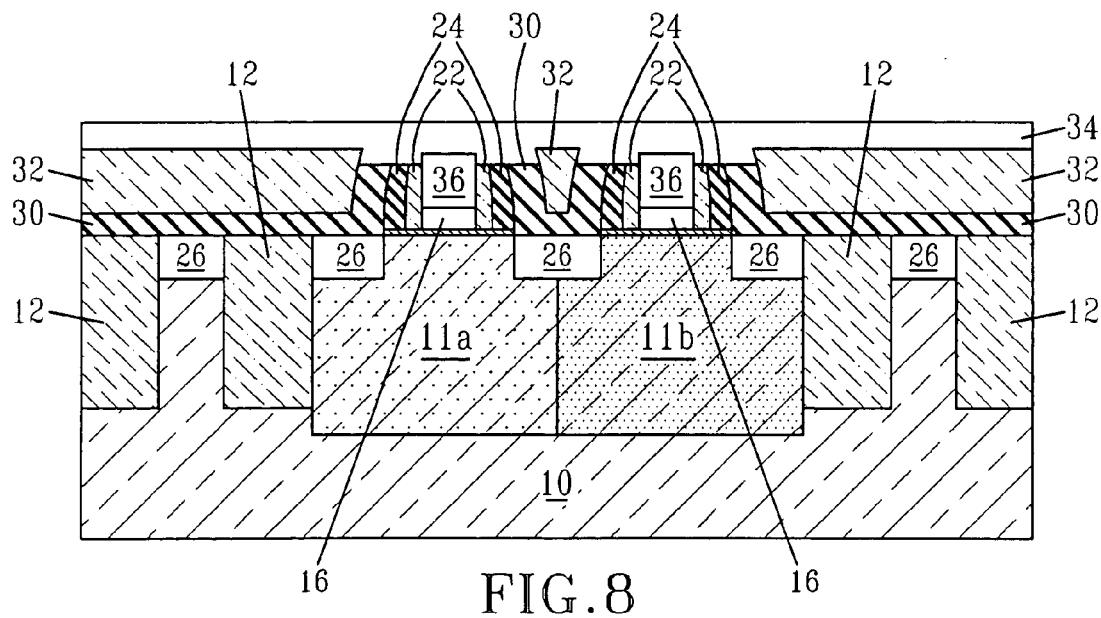
FIG. 8 is a pictorial representation (through a cross sectional view) showing the structure after the first self-aligned silicide anneal.

Next, and as shown in FIG. 6, a reactive-ion etch back process is performed such that the first dielectric layer 30 and dielectric cap 18 are selectively removed as compared to the second dielectric layer 32. For example, when the first dielectric layer and the dielectric cap are composed of $Si_3N_4$ and the second dielectric layer is composed of $SiO_2$, the nitride is selectively removed as compared with oxide. This reactive-ion etch back step exposes the polysilicon gate 16 of each gate stack 20. The structure after the reactive-ion etch back step has been performed is shown, for example, in FIG. 6. It is noted that the reactive-ion etch back step does not etch the polysilicon gates 16. Since the polysilicon gates 16 have not been etched, their thickness (i.e., height), regardless of dimension (i.e., length), will be substantially the same.

A second salicide process is then performed to consume the polysilicon gates 16 forming metal silicide gates. The drawings that following illustrate an embodiment in which two anneal steps are required. In some embodiments, the salicide process is complete after the selective etching step. Thus, the second anneal is not needed in such an embodiment since the first anneal forms a low resistance phase metal silicide gate.

The first step of the second salicide process includes depositing a blanket silicide metal 34 atop the structure shown in FIG. 6. The resultant structure including the blanket silicide metal 34 is shown, for example, in FIG. 7. The silicide metal 34 can be deposited using one of the deposition processes mentioned above in forming the metal used in source/drain silicide contact formation.

The silicide metal 34 can be composed of Ti, Ta, W, Co, Ni, Pt, Pd or alloys thereof. In one embodiment, the silicide metal 34 is Co; $CoSi_2$ forms using a two step annealing process. In another embodiment of the present invention, the silicide metal 34 is Ni or Pt; NiSi and PtSi form using a single annealing step. The silicide metal thickness is selected so as to form the silicide phase with the appropriate workfunction for the particular CMOS device. For example, NiSi has a workfunction of 4.65 eV, and if the initial polysilicon height is 50 nm, the amount of Ni needed is about 27 nm. $CoSi_2$ has a workfunction of 4.45 eV, and if the initial polysilicon height is 50 nm, the amount of Co needed is about 14 nm. Although the silicide metal thicknesses given are the amount necessary to just consume the polysilicon, it is preferred if the thickness were in excess by about 10% to make sure consumption is complete.

In some embodiments (not shown), an oxygen diffusion barrier such as TiN or W is formed atop the silicide metal.

Figure 9:
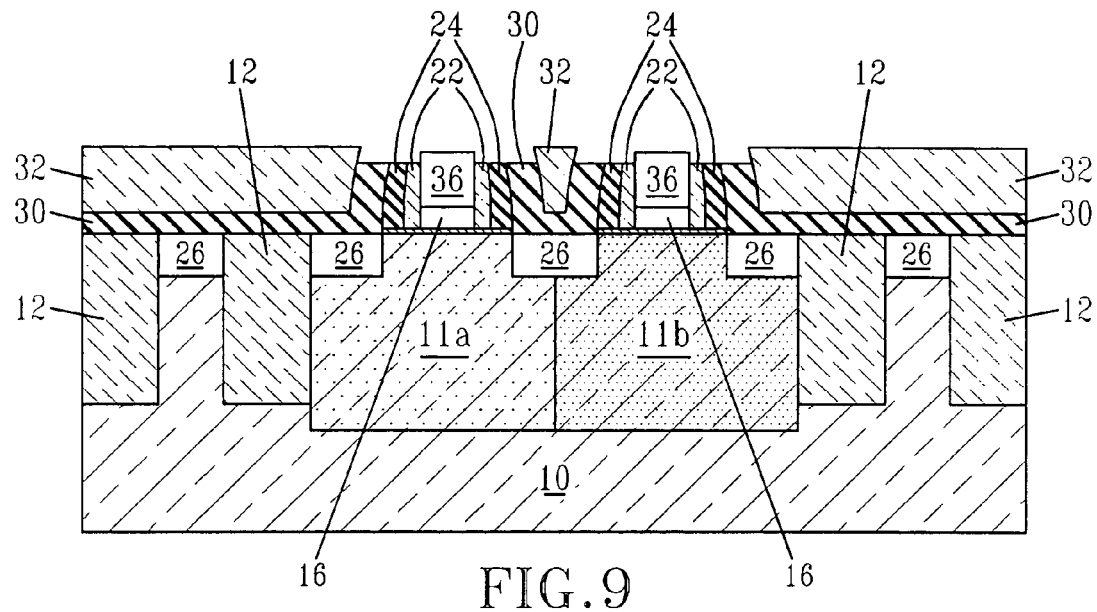
FIG. 9 is a pictorial representation (through a cross sectional view) showing the structure after performing a silicide selective etch.
Figure 10:
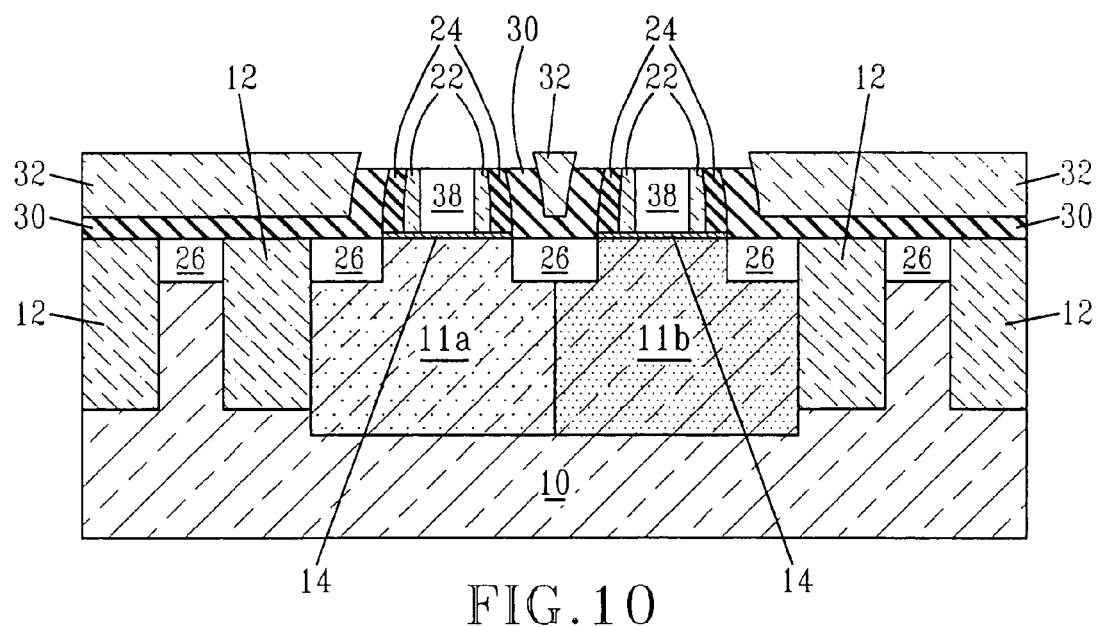
FIG. 10 is a pictorial representation (through a cross sectional view) showing the structure after performing an optional second self-aligned silicide anneal.

After deposition of the silicide metal 34, a first anneal is employed to form a first silicide phase 36 in the structure; the first silicide phase may or may not represent the lowest resistivity phase of a metal silicide. See FIG. 8. The first anneal is performed utilizing the ambients and temperatures described above in forming the source/drain silicide contacts 26. Next, and as shown in FIG. 9, a selective wet etch step is employed to remove any non-reactive silicide metal from the structure.

For some metal silicides, the salicide process may be stopped at this point since the polysilicon is consumed and the resistivity of the first silicide phase 36 is close to minimum values for the phase. This is in the case for Ni and Pt. This embodiment is not shown. In other cases, for example when Co or Ti are used as the silicide metal, a second higher temperature anneal (as described above) is needed for the consumption of the remaining polysilicon and forming a second silicide phase material 38, See FIG. 10. In this embodiment, the first silicide phase is a high resistivity phase silicide material, while the second silicide phase material 38 is a lower resistivity phase silicide material.

After completion of the inventive metal silicide gate processing mentioned above, the conventional approach for building a multilayer interconnect structure for transistor to transistor and transistor to external contacts can be employed.

As stated above, the processing steps of the first embodiment of the present invention are capable of fabricating a CMOS structure in which each metal silicide gate has the same phase and is of substantially the same height regardless of its dimension. Another characteristic feature of the CMOS structure formed using the aforementioned integration processing scheme, is that each metal silicide gate with the same polySi ion implant conditions will have substantially the same workfunction.

Reference is made to FIGS. 11A–11E, which are cross sectional views of a CMOS structure during various stages of the second embodiment of the present invention. Although these drawings show the presence of two polySi gates (i.e., a CMOS transistor structure with pFET and nFET transistors), the present invention is not limited to that number of polySi gates. Instead, the present integration process works for any number of polySi gates. Hence, a plurality of polySi gates may be present across a single semiconductor structure.

Figure 11A:
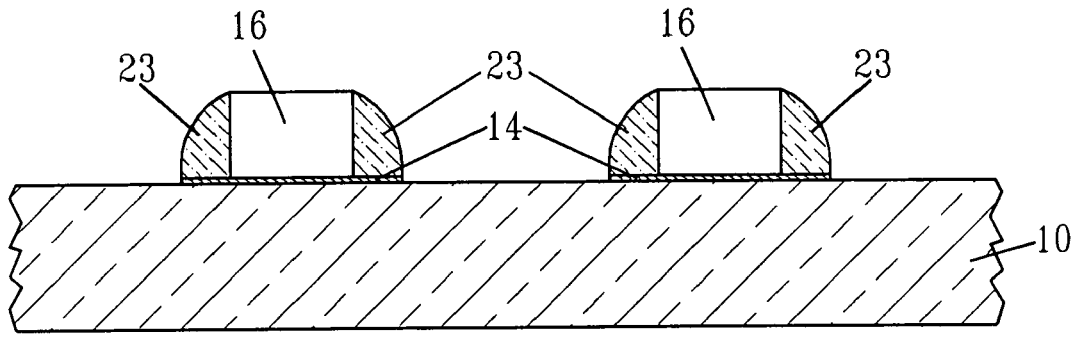
FIGS. 11A–11E are pictorial representations (through cross sectional views) illustrating the basic process flow of the second embodiment of the present invention.

FIG. 11A shows an initial structure that can be employed in the second embodiment of the present invention. As shown, the initial structure includes a semiconductor substrate 10, patterned gate dielectric 14 located on a surface of the semiconductor substrate 10, a patterned polySi gate 16 located atop a surface portion of the patterned gate dielectric 14 and spacers 23 formed on exposed vertical sidewalls of each patterned polySi gate 16. The structure shown in FIG. 11A includes the same material as in the first embodiment and a similar process flow as used in forming the structure shown in FIG. 2 is used in forming the same. The doped regions and the isolation regions are not depicted in this embodiment. Nevertheless, the same can be contained within the semiconductor substrate 10. Note that in this embodiment a single spacer 23 is shown on each exposed vertical sidewalls of the patterned polySi gate 16. Although a single spacer is shown, the second embodiment works when double spacers 22 and 24 (as shown in FIG. 2) are employed. The single spacer 23 can be composed of an oxide, nitride, oxynitride or any combination thereof.

Figure 11B:
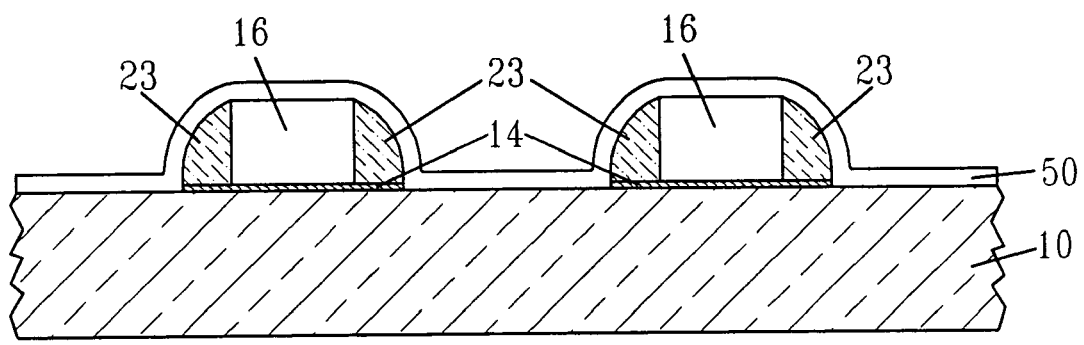

Following formation of the initial structure shown in FIG. 11A, silicide metal 50 is formed atop all exposed surfaces (vertical and horizontal) of the initial structure providing the structure shown, for example, in FIG. 11B. The silicide metal 50 employed in the second embodiment of the present invention comprises Ti, Ta, W, Co, Ni, Pt, Pd or alloys thereof. The silicide metal 50 is formed utilizing a conformal deposition process such as, for example, physical vapor deposition (sputtering), chemical vapor depositions, atomic layer deposition or plating. The silicide metal 50 may have a variable thickness depending upon the type of metal being deposited and the technique used in forming the same. Typically, however, the silicide metal 50 has a thickness, after deposition, from about 0.5 to about 25 nm.

In embodiments wherein the semiconductor substrate 10 is not comprised of a Si-containing material, a Si-containing material may be formed atop the exposed surfaces of the non-Si-containing substrate prior to formation of silicide metal 50.

A material that is capable of reflowing (hereinafter referred to as reflow material) is then formed via conventional deposition techniques atop the structure shown in FIG. 11B. The reflow material comprises an antireflective coating (ARC) or a spin-on dielectric material. The thickness of the deposited reflown material may vary, but typically the deposited reflow material has a thickness that is less than the height of the polySi gates 16. Specifically, the as deposited reflow material has a thickness from about 20 to about 180 nm.

Figure 11C:
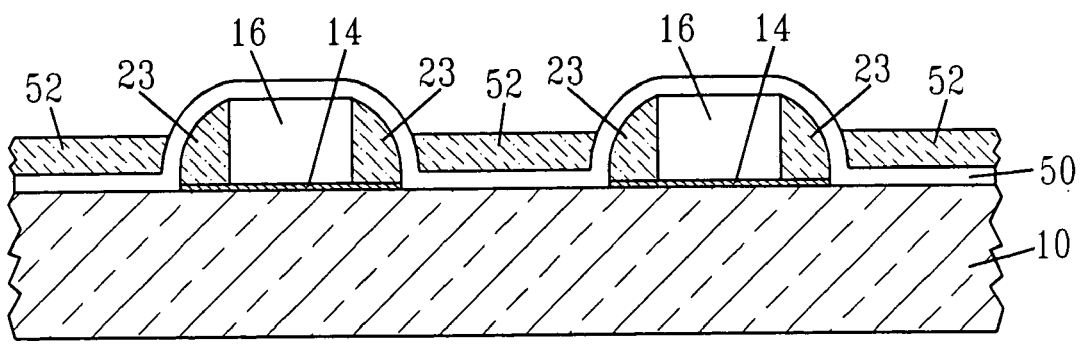
Figure 11D:
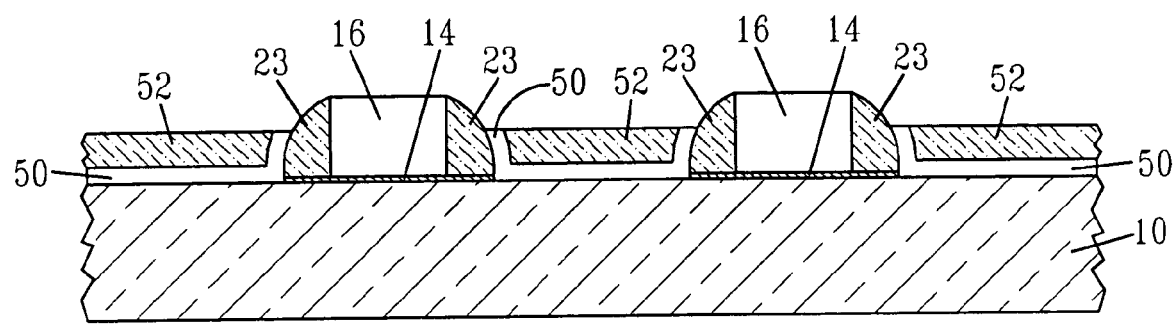

After deposition, the reflow material is recessed providing the structure shown, for example, in FIG. 11C. In FIG. 11C, reference numeral 52 denotes the recessed, reflow material. An etch step may be used to further recess the reflow material. As shown, the recessed, reflow material 52 has an upper surface that is less than the height of the polySi gates 16. As consequence, the recessed, reflow material 52 is located only between the polySi gates 16 at this point of the second embodiment of the present invention.

After formation of recessed, reflow material 52, the silicide metal 50 atop each polySi gate 16 is removed thereby exposing an upper surface of each polySi gate 16. The resultant structure that is formed after removing the silicide metal 50 from atop the polySi gates 16 is shown, for example, in FIG. 11D. The removal of the silicide metal 50 atop the polySi gates 16 is performed utilizing an etching process that selectively removes metal as compared with dielectric or polySi. Specifically, a wet etch process that employs a sulfuric acid/hydrogen peroxide solution can be employed in this step of the present invention.

At this point of the second embodiment of the present invention, the recessed, reflow material 52 is removed from the structure utilizing a stripping process that selectively removes the ARC or spin-on material and thereafter an annealing process is performed.

The annealing process may include a first annealing and optionally a second anneal. Unreacted metal may be removed either after the first anneal or after the second optional anneal. The first anneal is typically performed at lower temperatures than the second annealing step. Typically, the first annealing step, which may, or may not, form a high resistance silicide phase material, is performed at a temperature from about 300° to about 600° C. using a continuous heating regime or various ramp and soak heating cycles. More preferably, the first annealing step is performed at a temperature from about 350° to about 550° C. The second annealing step is performed at a temperature from about 600° C. to about 800° C. using a continuous heating regime or various ramp and soak heating cycles. More preferably, the second annealing step is performed at a temperature from about 650° C. to about 750° C. The second anneal typically converts the high resistance silicide into a silicide phase of lower resistance.

The silicide anneals are carried out in a gas atmosphere, e.g., He, Ar, $N_2$ or forming gas. The source/drain silicide contact annealing steps may use different atmospheres or the annealing steps may be carried out in the same atmosphere. For example, He may be used in both annealing steps, or He can be used in the first annealing step and a forming gas may be used in the second annealing step. The unreacted metal is removed utilizing an etching process that selectively removes metal. Examples include wet etching using a sulfuric acid/hydrogen peroxide solution.

Figure 11E:
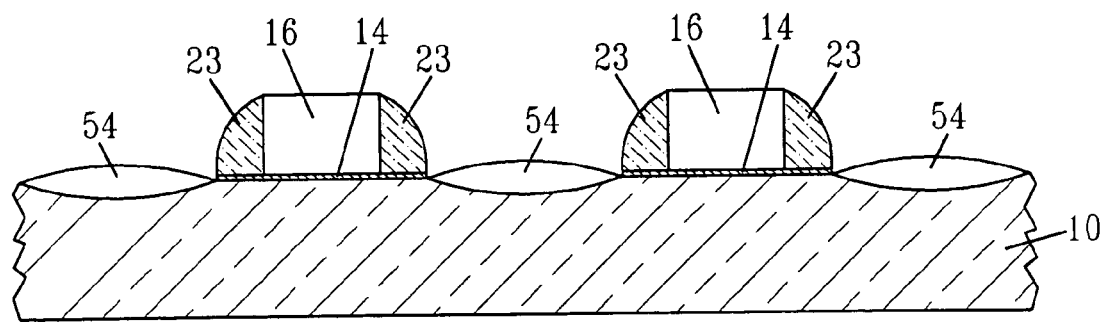

FIG. 11E shows the resultant structure that is formed after annealing and forming silicide contacts 54. Note that the method of the present invention provides a structure in which each polySi 16 gate has the same height regardless of the dimension of the polySi gate 16.

At this point of the second embodiment of the present invention, the polySi gates 16 can be converted into silicide metal gates that have substantially the same height, phase and workfunction with the same polySi predoping conditions. The silicide metal gates can be formed utilizing the salicide process mentioned in the first embodiment of the present invention. In particular, the silicide metal gates can be formed by first providing a dielectric capping layer (e.g., $Si_3N_4$, $SiO_2$, $SiO_2$ on $Si_3N4$ etc.) on the structure such that only the polySi gates 16 and the dielectric capping layer are in contact with a subsequently deposited silicide metal. This step of the present invention caps the source/drain regions with a dielectric layer so that the silicide metal used in gate formation is not in contact with the source/drain regions. A possible approach for the capping layer is to deposit a blanket $Si_3N_4$ layer followed by deposition of a density plasma (HDP) $SiO_2$ layer (thickness greater than the gate height). Chemical-mechanical polishing can be used to planarize the HDP $SiO_2$ stopping at or slightly in the $Si_3N_4$ layer. If some $SiO_2$ is left, a wet etch process can be used to remove the $SiO_2$. A selective RIE process is used to remove $Si_3N_4$ on the gate and a silicide metal is then deposited and subjected to the above described salicide process.

Reference is made to FIGS. 12A–12F, which are cross sectional views of a CMOS structure during various stages of the third embodiment of the present invention. Although these drawings show the presence of two polySi gates (i.e., a CMOS transistor structure with pFET and nFET transistors), the present invention is not limited to that number of polySi gates. Instead, the present integration process works for any number of polySi gates. Hence, a plurality of polySi gates may be present across a single semiconductor structure.

Figure 12A:
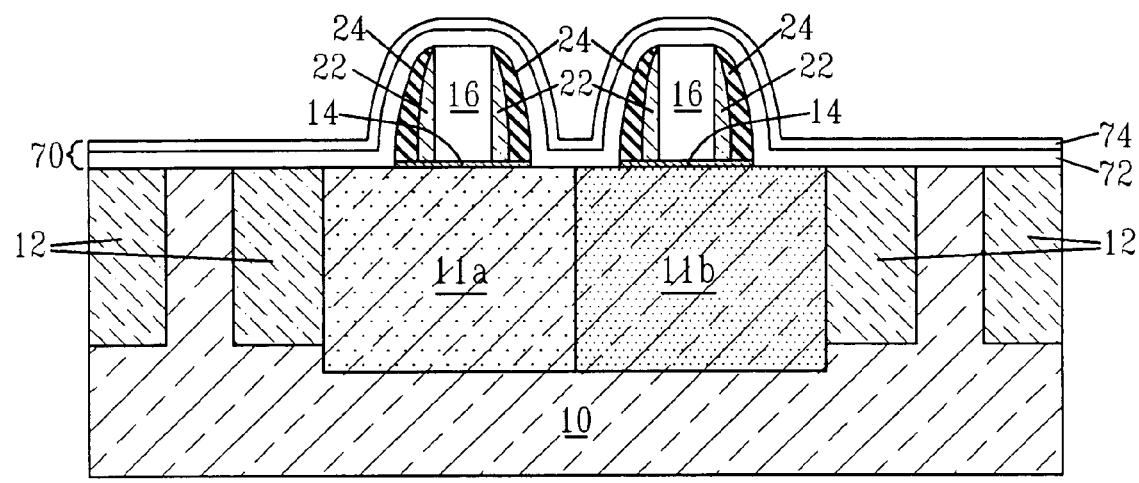
FIGS. 12A–12F are pictorial representations (through cross sectional views) illustrating the basic process flow of the third embodiment of the present invention.

FIG. 12A shows an initial CMOS structure that can be employed in the second embodiment of the present invention. As shown, the initial structure includes a semiconductor substrate 10 having first doped region 11a, second doped region 11b and isolation regions 12 formed therein, patterned gate dielectric 14 located on a surface of the semiconductor substrate 10, a patterned polySi gate 16 located atop a surface portion of the patterned gate dielectric 14 and spacers 22 and 24 formed on exposed vertical sidewalls of each patterned polySi gate 16. The foregoing components of the initial structure employed in the third embodiment of the present invention are similar to those shown in FIG. 2 except that dielectric cap 18 is not present atop the polySi gates 16.

The structure of FIG. 12A also includes bilayer stack 70 that comprises a metal-containing layer 72 and a capping layer 74. As shown, the metal-containing layer 70 is formed first and thereafter the capping layer 74 is formed.

The metal-containing layer 72 of the bilayer stack 70 is composed of any metal that is capable of reacting with silicon to form a metal silicide. Examples of such metals include, but are not limited to: Ti, Ta, W, Co, Ni, Pt, Pd or alloys thereof. A stack of these metals may also be used as the metal-containing layer 70. Of these various metals it is preferred that Co or Ni be employed. The metal-containing layer 72 of the bilayer stack 70 is a layer whose thickness is typically from about 0.5 to about 25 nm, with a thickness from about 0.5 to about 15 nm being more typical.

The metal-containing layer 72 of the bilayer stack 70 is formed utilizing any conventional deposition process including, for example, physical vapor deposition (sputtering or evaporation), chemical vapor deposition, atomic layer deposition, chemical solution deposition, plating and the like.

The capping layer 74 of the bilayer stack 70, which is formed atop the metal-containing layer 72, includes any material that can prevent oxygen incorporation into the underlying metal used to form the silicide. Illustrative examples of such capping layers include TiN, W, or Ti. The capping layer 72 typically has a thickness from about 5 to about 50 nm, with a thickness from about 10 to about 25 nm being more typical. The capping layer 72 is formed utilizing a conventional deposition process such as, for example, physical vapor deposition or chemical vapor deposition.

Figure 12B:
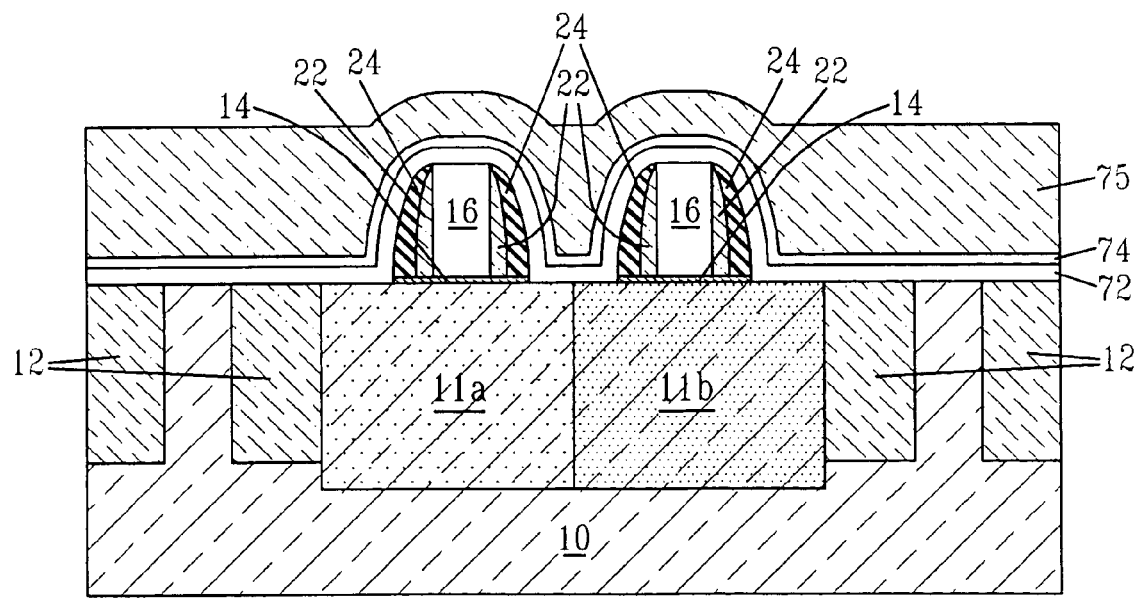

Next, a planarizing dielectric 75 is formed atop the structure shown in FIG. 12A providing the structure in FIG. 12B. The planarizing dielectric 75 may comprise a photoresist, a low-temperature oxide (LTO) or other like dielectric that is capable of serving as a planarizing layer. The original thickness of the planarizing dielectric 75, prior to planarization, may vary, but it must have a thickness that is higher than the height of the polySi gates 16.

Figure 12C:
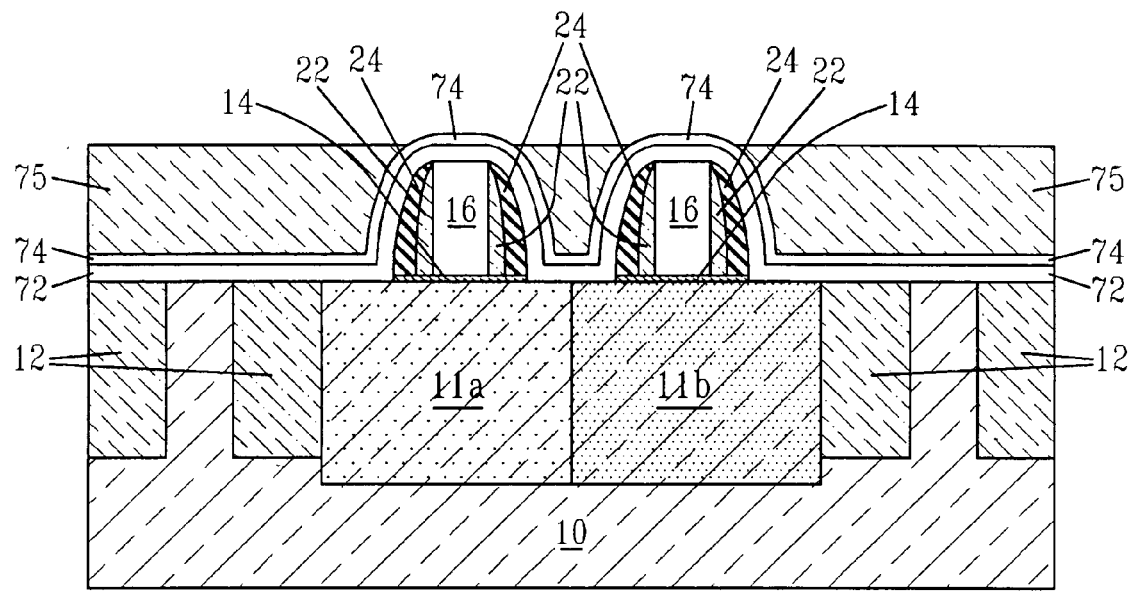

The planarizing dielectric 75 is then planarized by a conventional planarization process including, for example, chemical mechanical polishing and/or grinding so as to provide the structure shown, for example, in FIG. 12C. During planarization, the planarizing dielectric 75 located above each polySi gate 16 is removed so as to expose the underlying capping layer 74 of the bilayer stack 70. In this embodiment of the present invention, the capping layer 74 atop the polySi gates 16 serves as a CMP etch stop layer.

Next, the exposed capping layer 74 is removed exposing underlying metal-containing layer 72. The capping layer 74 that is exposed is removed utilizing a selective wet etch process.

Figure 12D:
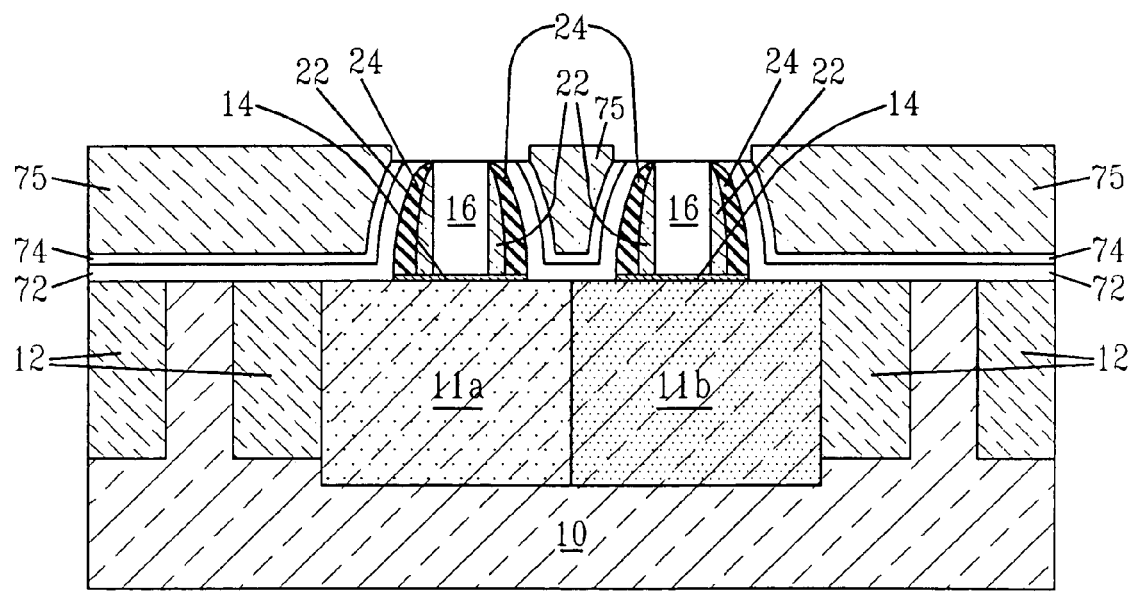
Figure 12E:
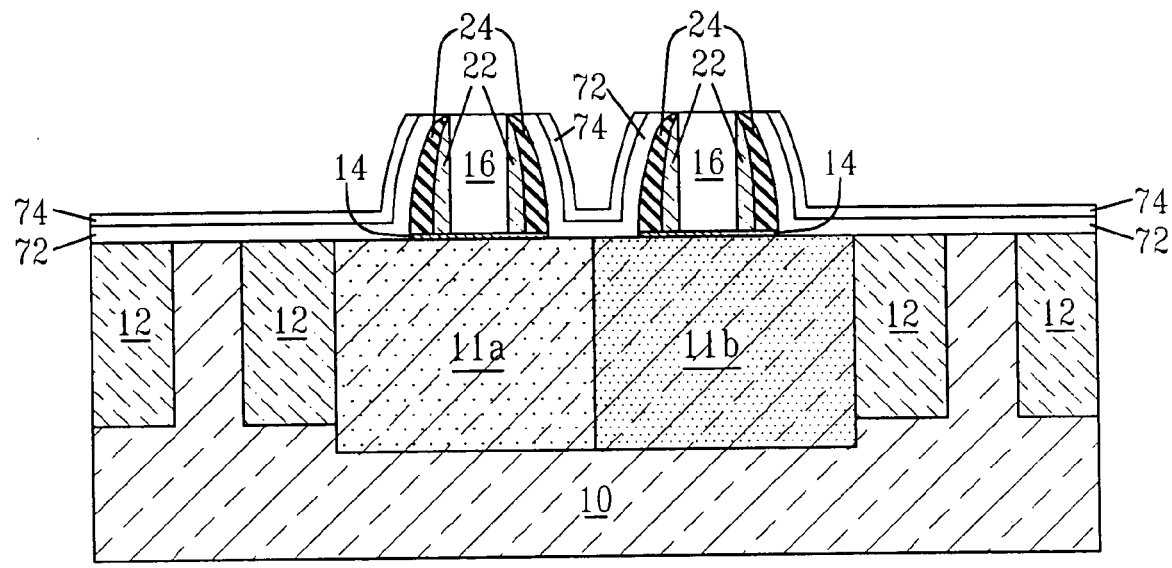

The exposed metal-containing layer 72 atop each polySi gate 16 is then removed so as to expose an upper surface of the polySi gates 16, See FIG. 12D. The exposed metal-containing layer 72 is removed utilizing an etching process that selectively removes metal. Examples include wet etching using a sulfuric acid/hydrogen peroxide solution.

After selectively removing the exposed metal-containing layer 72 from atop each polySi gate 16, the abutting planarizing material 75 is removed utilizing an etching process that selectively removes photoresist or low temperature oxide. The resultant structure formed following the above process steps is shown, for example, in FIG. 12E.

Figure 12F:
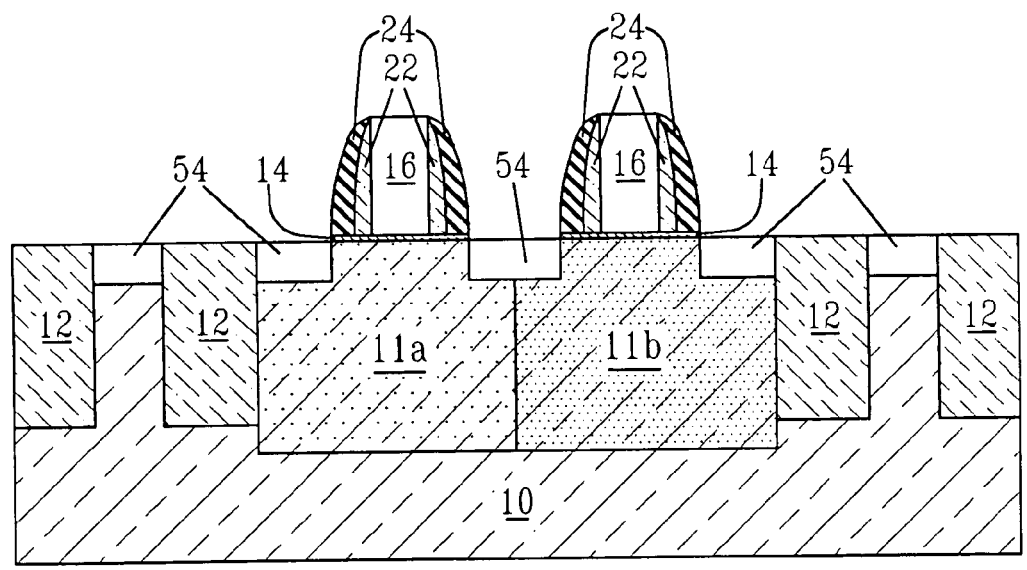

An annealing process is next performed with causes formation of silicide contacts 54, See FIG. 12F. The annealing process may include a first annealing and optionally a second anneal. Unreacted and capping layer metal may be removed either after the first anneal or after the second optional anneal. The first anneal is typically performed at lower temperatures than the second annealing step. Typically, the first annealing step, which may, or may not, form a high resistance silicide phase material, is performed at a temperature from about 300° to about 600° C. using a continuous heating regime or various ramp and soak heating cycles. More preferably, the first annealing step is performed at a temperature from about 350° to about 550° C. The second annealing step is performed at a temperature from about 600° C. to about 800° C. using a continuous heating regime or various ramp and soak heating cycles. More preferably, the second annealing step is performed at a temperature from about 650° C. to about 750° C. The second anneal typically converts the high resistance silicide into a silicide phase of lower resistance.

The silicide anneals are carried out in a gas atmosphere, e.g., He, Ar, $N_2$ or forming gas. The source/drain silicide contact annealing steps may use different atmospheres or the annealing steps may be carried out in the same atmosphere. For example, He may be used in both annealing steps, or He can be used in the first annealing step and a forming gas may be used in the second annealing step. After annealing the dielectric cap 74 and the unreacted metal (i.e., metal-containing layer 72) are removed utilizing etching processes that selectively remove those materials.

FIG. 12F shows the resultant structure that is formed after annealing and forming silicide contacts 54. Note that the method of the present invention provides structure in which each polySi gate 16 has the same height regardless of the dimension of the polySi gate 16.

In the third embodiment, silicide metal gates can be formed as described above in the second embodiment of the present invention.

In the various embodiments of the present invention mentioned above, the metal employed in forming the silicide may include an alloying additive that can enhance the formation of a metal silicide. Examples of alloying additives that may be employed in the present invention include: C, Al, Ti, V, Cr, Mn, Fe, Co, Ni, Cu, Ge, Zr, Nb, Mo, Ru, Rh, Pd, Ag, In, Sn, Hf, Ta, W, Re, Ir, Pt or mixtures thereof, with the proviso that the alloying additive is not the same as the metal used in forming the silicide. When present, the alloying additive is present in an amount from about 0.1 to about 50 atomic percent.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A process for fabricating a complementary metal oxide semiconductor (CMOS) structure comprising:
   providing a plurality of polySi gates overlying a semiconductor substrate, each polySi gate comprises a dielectric cap located on an upper surface thereof; wherein said dielectric cap comprises a first dielectric material;
   forming silicided source/drain regions in the semiconductor substrate;
   forming a dielectric stack on the semiconductor substrate; wherein said dielectric stark comprises a first lower dielectric layer and a second, upper dielectric layer, wherein the first, lower dielectric layer comprises the first dielectric material, and wherein the second, upper dielectric layer comprises a second, different dielectric material;
   planarizing the dielectric stark to remove an upper portion of the second, upper dielectric layer;
   performing an etching process to selectively remove the first, lower dielectric layer and the dielectric cap gainst the second, upper dieleetric layer to thereby epose only an upper surface of each polySi gate, wherein the exposed upper surface of each polySi gate is below an upper surface of the second, upper dielectric layer; and
   performing a salicide process which converts each polySi gate to a metal silicide gate, wherein each metal silicide gate has substantially the same height, is composed of the same silicide phase, and has substantially the same workfunction for the same polySi ion implant conditions.

2. The method of claim 1 wherein the plurality of polySi gates are formed atop a gate dielectric.

3. The method of claim 1 wherein the plurality of polySi gates are formed by deposition, lithography and etching.

4. The method of claim 1 wherein the dielectric cap is composed of a nitride.

5. The method of claim 1 wherein the step of providing the plurality of polySi gates includes the formation of at least one spacer on each exposed sidewall of the polySi gates.

6. The method of claim 5 wherein the at least one spacer includes a first spacer and a second spacer, wherein the first spacer has a thickness that is narrower than the second spacer.

7. The method of claim 1 wherein the step of forming the silicided contacts on source/drain regions comprises depositing a metal atop the semiconductor substrate, and performing a salicide process.

8. The method of claim 7 wherein the metal comprises Ti, Ta, W, Co, Ni, Pt, Pd or alloys thereof.

9. The method of claim 8 wherein the metal is Co, Ni or Pt.

10. The method of claim 7 wherein the salicide process comprises a first anneal, a selective etching step and optionally a second anneal.

11. The method of claim 7 further comprising forming a layer of silicon atop the semiconductor substrate prior to metal deposition.

12. The method of claim 1 wherein the first dielectric material is a nitride, and wherein the second, different dielectric material is an oxide.

13. The method of claim 1 wherein the step of planarizing comprises chemical mechanical polishing.

14. The method of claim 1 wherein the etching process comprises a reactive ion etch step.

15. The method of claim 1 wherein the salicide process comprises depositing a blanket silicide metal layer atop the at least the exposed upper surface of each polySi gate, first annealing to cause total or partial consumption of the polySi gates, selective etching non-reacted silicide metal and optionally performing a second anneal.

16. The method of claim 15 wherein the silicide metal comprises Ti, Ta, W, Co, Ni, Pt, Pd or alloys thereof.

17. The method of claim 16 wherein the silicide metal is Co, Ni or Pt.

18. The method of claim 15 the first anneal is performed at a temperature from about 350° to about 550° C.

19. The method of claim 15 wherein the optional second anneal is performed at a temperature from about 600° C. to about 800° C.

* * * * *

UNITED STATES PATENT AND TRADEMARK OFFICE
CERTIFICATE OF CORRECTION

PATENT NO. : 7,056,782 B2  Page 1 of 1
APPLICATION NO. : 10/786901
DATED : June 6, 2006
INVENTOR(S) : Ricky S. Amos et al.

It is certified that error appears in the above-identified patent and that said Letters Patent is hereby corrected as shown below:

Column 14, Line 42, Claim 1:
"dielectric stark comprises" should read -- dielectric stack comprises --

Column 14, Line 48, Claim 1:
"stark" should read -- stack --

Column 14, Line 51, Claim 1:
"gainst" should read -- against --

Column 14, Line 52, Claim 1:
"epose" should read -- expose --

Signed and Sealed this

Fourteenth Day of November, 2006

JON W. DUDAS
*Director of the United States Patent and Trademark Office*